United States Patent
Kim et al.

(10) Patent No.: US 9,576,774 B2
(45) Date of Patent: Feb. 21, 2017

(54) PLASMA WAVGUIDE USING STEP PART AND BLOCK PART

(71) Applicant: TRIPLE CORES KOREA CO., LTD., Gyeonggi-do (KR)

(72) Inventors: Ik Nyun Kim, Gyeonggi-do (KR); Sung Ok Kang, Gyeonggi-do (KR); Min Heum Eum, Gyeonggi-do (KR)

(73) Assignee: TRIPLE CORES KOREA CO., LTD., Gyeonggi-do (KR)

( * ) Notice: Subject to any disclaimer, the term of this patent is extended or adjusted under 35 U.S.C. 154(b) by 359 days.

(21) Appl. No.: 14/225,693

(22) Filed: Mar. 26, 2014

(65) Prior Publication Data
US 2014/0292195 A1 Oct. 2, 2014

(30) Foreign Application Priority Data

Mar. 27, 2013 (KR) ........................ 10-2013-0032748

(51) Int. Cl.
| | | |
|---|---|---|
| *H05H 1/46* | (2006.01) | |
| *H01J 37/32* | (2006.01) | |
| *H03H 7/38* | (2006.01) | |
| *H01P 5/02* | (2006.01) | |

(52) U.S. Cl.
CPC ........... *H01J 37/32229* (2013.01); *H03H 7/38* (2013.01); *H05H 1/46* (2013.01); *H01P 5/024* (2013.01); *H05H 2001/4622* (2013.01)

(58) Field of Classification Search
None
See application file for complete search history.

(56) References Cited

U.S. PATENT DOCUMENTS

| | | | | |
|---|---|---|---|---|
| 4,851,630 A * | 7/1989 | Smith | .................... | H05B 6/802 219/687 |
| 4,866,346 A * | 9/1989 | Gaudreau | ......... | H01J 37/32192 118/723 R |
| 4,987,346 A * | 1/1991 | Katzschner | ............. | H01J 37/08 118/723 FI |
| 5,276,386 A * | 1/1994 | Watanabe | ......... | H01J 37/32266 204/298.38 |
| 5,389,153 A * | 2/1995 | Paranjpe | ........... | H01J 37/32229 118/723 IR |
| 5,580,420 A * | 12/1996 | Watanabe | ......... | H01J 37/32192 156/345.41 |
| 5,804,033 A * | 9/1998 | Kanai | ............... | H01J 37/32229 118/723 MW |
| 6,031,333 A * | 2/2000 | Simpson | ............... | H01J 65/044 315/248 |
| 6,174,424 B1 * | 1/2001 | Wach | ................... | G01N 21/474 205/73 |
| 9,273,393 B2 * | 3/2016 | Glukhoy | ............... | C23C 16/453 |
| 2001/0015261 A1 * | 8/2001 | Kobayashi | ........ | H01J 37/32082 156/345.41 |

(Continued)

*Primary Examiner* — Douglas W Owens
*Assistant Examiner* — Srinivas Sathiraju

(57) ABSTRACT

In a magnetron and a plasma waveguide through which a microwave oscillated from the magnetron moves, there is provided a plasma waveguide including a plurality of step parts formed at any one side on an inner side surface of the waveguide, and a block part of a predetermined height formed at any other side on the inner side surface of the waveguide, wherein the block part is formed at a side opposite to a boundary part between the plurality of step parts.

16 Claims, 3 Drawing Sheets

(56) References Cited

U.S. PATENT DOCUMENTS

| | | | |
|---|---|---|---|
| 2006/0138099 A1* | 6/2006 | Namiki | C23C 16/0272 219/121.43 |
| 2011/0006682 A1* | 1/2011 | Kim | H01J 65/044 315/39 |
| 2012/0119648 A1* | 5/2012 | Neate | H01J 65/044 315/39 |
| 2014/0008326 A1* | 1/2014 | Toyoda | H05H 1/46 216/69 |
| 2015/0007940 A1* | 1/2015 | Kaneko | H01J 37/32311 156/345.41 |

* cited by examiner

< PRIOR ART >

PLASMA WAVGUIDE USING STEP PART AND BLOCK PART

CROSS-REFERENCE TO RELATED APPLICATION

This application claims priority of Korean Patent Application No. 10-2013-0032748, filed on Mar. 27, 2013, in the KIPO (Korean Intellectual Property Office), the disclosure of which is incorporated herein entirely by reference.

BACKGROUND OF THE INVENTION

Field of the Invention

The present disclosure relates to a plasma waveguide using a step part and a block part, and more particularly, to a plasma waveguide using a step part and a block part that may produce an effect of microwave matching while maximizing an effect of microwave concentration within the waveguide having a gradual reduction in height in a microwave propagation direction by using the step part simultaneously with the block part of a predetermined height provided at an inner side surface of the waveguide.

Description of the Related Art

A conventional plasma generator includes a waveguide to transmit electromagnetic waves, a 3-stub to tune a plasma impedance, and a plasma generation unit to generate a plasma, and the plasma generation unit is equipped with a discharge tube. When electromagnetic waves are transmitted to the waveguide, an electric field concentrates on the plasma generation unit of the waveguide where a plasma is generated.

Accordingly, how to concentrate an electric field effectively is an important design factor of a waveguide.

A waveguide has been developed on a trend toward gradual decrease in height from a traditional rectangular flat structure.

FIG. 1 is a full diagram illustrating a plasma reactor disclosed in Korean Patent Publication No. 10-2008-0033408 (hereinafter referred to as a related art).

Referring to FIG. 1, a plasma reactor according to the related art has a tapering shape with a height decreasing at a predetermined angle to concentrate an electric field (electromagnetic waves) being applied within a waveguide, and includes a reactor chamber at a rear end of the waveguide, in which a plasma is generated by application of the electric field. However, the related art discloses the tapered waveguide designed to minimize reflection of electromagnetic waves, but in practice, an effect of electric field concentration in the chamber where the plasma is generated, is lower than that of the rear end of the waveguide.

To solve this problem, Korean Patent No. 10-1196966 discloses a waveguide of a multi-taper structure. However, in this case, there is a problem—fine tuning of microwaves oscillated from a magnetron is difficult.

For fine tuning of microwaves, a 3-stub matching system 20 is used as shown in FIG. 1.

The 3-stub matching system has triple stubs installed at a stub interval of $\lambda g/4$ when $\lambda g$ is a wavelength in a waveguide 18, and serves to match a characteristic impedance of the waveguide 18 with a load impedance of a low height part of the waveguide 18 to transmit maximum power to a load.

However, such a 3-stub matching system is designed for maximum power transfer to a load in applications of a waveguide of a flat structure. Also, by a structure of the 3-stub matching system penetrating through the waveguide, leaks of a weak electromagnetic field out of the waveguide and its resultant arcing occur. To solve this problem, a high-cost sealing apparatus is separately required to prevent an electromagnetic field from leaking out of the waveguide.

SUMMARY OF THE INVENTION

It is thus an object of the present disclosure to provide a novel plasma waveguide system with improved economic and technical efficiency.

To achieve the above object, in a magnetron and a plasma waveguide through which a microwave oscillated from the magnetron moves, the present disclosure provides a plasma waveguide including a plurality of step parts formed at any one side on an inner side surface of the waveguide, and a block part of a predetermined height formed at any other side on the inner side surface of the waveguide, wherein the block part is formed at a side opposite to a boundary part between the plurality of step parts.

In one embodiment, the height of the block part occupies from 30% to 70% based on a waveguide height of a low height among the step parts.

In one embodiment, the step parts are a taper part with a height decreasing at a predetermined angle.

In one embodiment, the block part is included within an area opposite to the taper part.

In one embodiment, the block part is coupled with the inner side surface of the waveguide, and a location of the block part is adjustable.

The present disclosure forms a step part having a height decreasing to a predetermined level within a waveguide, and provides a block part of a predetermined height at an inner side surface of the waveguide opposite to the step part of the waveguide. Thereby, a problem with microwave leaks involved in a 3-stub system penetrating through an overall waveguide and a problem with damage to an external system due to microwaves traveling outward may be effectively solved. Further, because the block part of the predetermined height provided at the inner side surface of the waveguide is located at an opposite surface to the step part, an effect of microwave concentration within the waveguide having a gradual reduction in height in a microwave propagation direction may be maximized.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
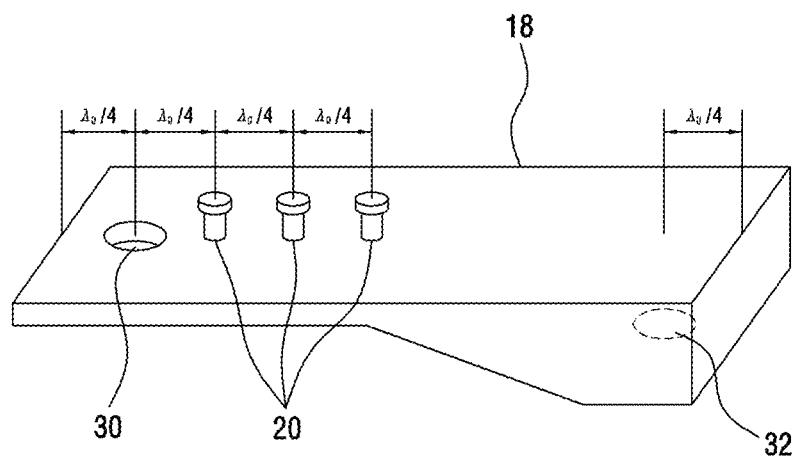
FIG. 1 is a full diagram illustrating a plasma reactor disclosed in Korean Patent Publication No. 10-2008-0033408 (hereinafter referred to as a related art).

The present disclosure now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In addition, when the elements of each of the figures are denoted by reference numerals, it should be noted that like elements are denoted by like reference numerals although illustrated in different figures. In addition, in the description of the present disclosure, details of well-known configurations or functions may be omitted to avoid unnecessary obscuring the gist of the present disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, in the description of the elements of the present disclosure, the terms first, second, A, B, (a), and (b) can be used. The terms are used to distinguish one element from another, and are not intended to limit the nature, the order, or the turn of the corresponding elements. In a case where it is described that an element is "connected", "joined", or "linked" to other components, it will be understood that the component may be directly connected or linked to the other components, and another component may be "connected", "joined", or "linked" between the components.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

In order to solve the above problem, the present disclosure forms a step part having a height decreasing to a predetermined level within a waveguide, and provides a block part of a predetermined height at an inner side surface of the waveguide opposite to the step part of the waveguide. Thereby, a problem with microwave leaks involved in a 3-stub system penetrating through an overall waveguide and a problem with damage to an external system due to microwaves traveling outward may be effectively solved. Further, because the block part of the predetermined height provided at the inner side surface of the waveguide is located at an opposite surface to the step part, an effect of microwave concentration within the waveguide having a gradual reduction in height in a microwave propagation direction is maximized.

Hereinafter, a waveguide system according to the present disclosure is described in detail using the drawings.

Figure 2:
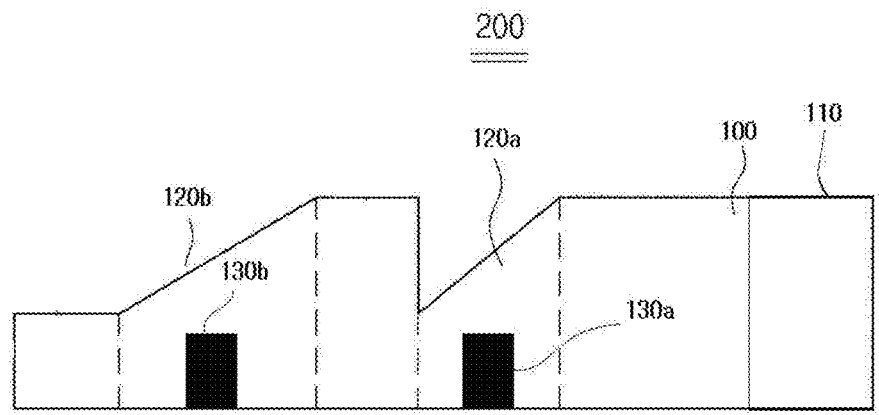
FIG. 2 is a cross-sectional view illustrating a waveguide system according to an exemplary embodiment.

FIG. 2 is a cross-sectional view illustrating a waveguide system according to an exemplary embodiment.

Referring to FIG. 2, the waveguide system according to an exemplary embodiment includes a magnetron 110 from which microwaves are generated. The microwaves generated from the magnetron 110 propagate in one direction inside a waveguide 100, and in this instance, the waveguide system has at least one step part 120a and 120b. In an exemplary embodiment, the step part represents a structure in which an effective height within the waveguide reduces in a microwave propagation direction, and is formed of a tapering shape as shown in FIG. 2. In an alternative embodiment, each of the step parts is formed of a tapering shape.

Particularly, the Inventor discovered that, in the case of a conventional waveguide of a double taper structure which has been published and registered, a substantial effect of microwave concentration was not high, and further, microwaves concentrated on only a reduced height part (that is, a rear end of a taper) of a waveguide, which in turn, an increase in microwave density was not achieved throughout the overall waveguide. Further, in case a 3-stub matching system penetrating through a waveguide from an outside is used in a waveguide of a double taper structure, the Inventor found out a problem with microwave leaks at stub penetration regions by reflection of unconcentrated microwaves or the like, causing damage to an external equipment.

To solve the problem, the plasma waveguide system according to an exemplary embodiment has block parts 130a and 130b of a predetermined height at an inner side surface of the waveguide opposite to the step parts 120a and 120b. The block parts of the predetermined height may have a cross section of a circular or rectangular shape, and preferably, has a cross section of a circular shape.

In an exemplary embodiment, a number of the block parts 130a and 130b corresponding to the step parts are coupled to the inner side surface of the waveguide. For example, in FIG. 2, the waveguide has the two tapered step parts 120a and 120b, and the block parts 130a and 130b are coupled to the inner side surface of the waveguide opposite to each of the two tapered step parts.

Figure 3:
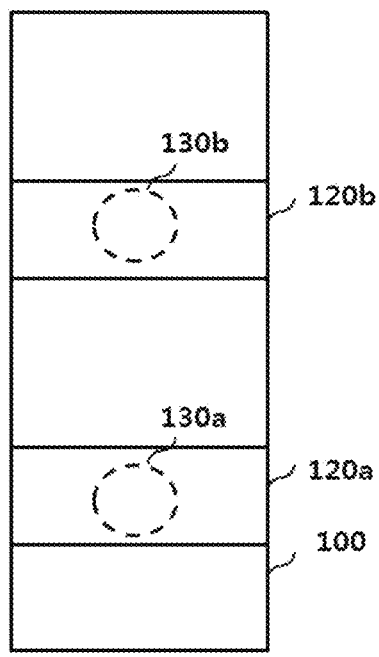
FIG. 3 is a cutaway plane view illustrating a waveguide according to an exemplary embodiment.

FIG. 3 is a cutaway plane view illustrating the waveguide according to an exemplary embodiment.

Referring to FIG. 3, the waveguide according to an exemplary embodiment includes the at least two step parts 120a and 120b at one side of the waveguide, and at the other side of the waveguide opposite to the step parts 120a and 120b, the block parts 130a and 130b protruding to the predetermined height from the other side.

In an exemplary embodiment, locations of the block parts 130a and 130b are included within areas of the at least two tapered step parts 120a and 120b, hence microwave matching and concentration occurs concurrently based on a combination of the height reduction by the tapers and the protruding block parts in the reduced height areas.

In the present disclosure, the height of the block parts is very important in an effect of microwave concentration and matching at the step part, and its description is provided below.

Figure 4:
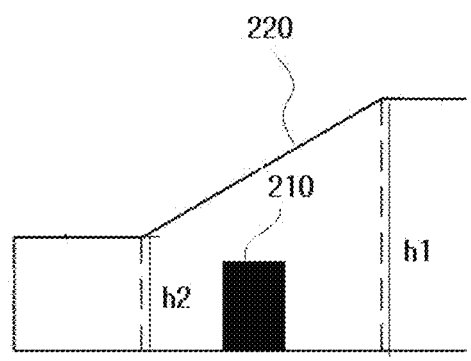
FIG. 4 is a diagram illustrating a height ratio of a block part according to an exemplary embodiment.

FIG. 4 is a diagram illustrating a height ratio of the block part according to an exemplary embodiment.

Referring to FIG. 4, a block part 210 according to an exemplary embodiment is configured to sit opposite to a step part 220 of a waveguide in which a height difference occurs.

The step part 220 has at least two heights; one is a high height h1 and the other is a low height h2. In this instance, a height of the block part 210 is, based on the low height h2, preferably from 30% to 70% of the low height of the waveguide. If the height of the block part 210 is less than the numerical range, an effect of microwave matching by the block part 210 reduces, and as microwaves of various wavelengths propagate simultaneously to the low height part of the step part, an effect of microwave concentration also reduces. In contrast, if the height of the block part 210 exceeds the numerical range, microwaves reflect by the block part 210 and the reflected microwaves interfere with incoming microwaves.

Accordingly, preferably, the block part used at a location opposite to the step part is so high as to limit the lowest height part of the step part to a predetermined level, and an effect of microwave matching/concentration by the simultaneous use of the step part and the block part is maximized.

Further, the present disclosure provides a waveguide system using a cascade-shaped step part having a vertically decreasing height, rather than a step part of a tapering shape with a height decreasing at a predetermined angle, and simultaneously with a corresponding block part.

Figure 5:
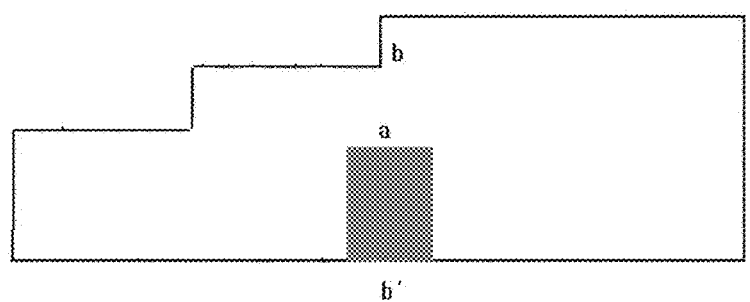
FIG. 5 is a diagram illustrating a waveguide system according to an exemplary embodiment.

FIG. 5 is a diagram illustrating a waveguide system according to an exemplary embodiment.

Referring to FIG. 5, a waveguide includes a plurality of step parts having a vertically decreasing height, and a block part of a predetermined height at an inner side surface of the waveguide opposite to the step parts.

In such construction, an area a having the block part is configured to include a surface b' opposite to a boundary surface of the step parts (that is, a waveguide location b at which a height reduction occurs). Thereby, similar to a block part included within a taper area, an effect of microwave concentration and matching may be maximized within the waveguide area in which the taper and the block part are provided simultaneously.

In another exemplary embodiment, the block part is a separate member that is not physically coupled to the waveguide, and its location is adjustable.

Figure 6:
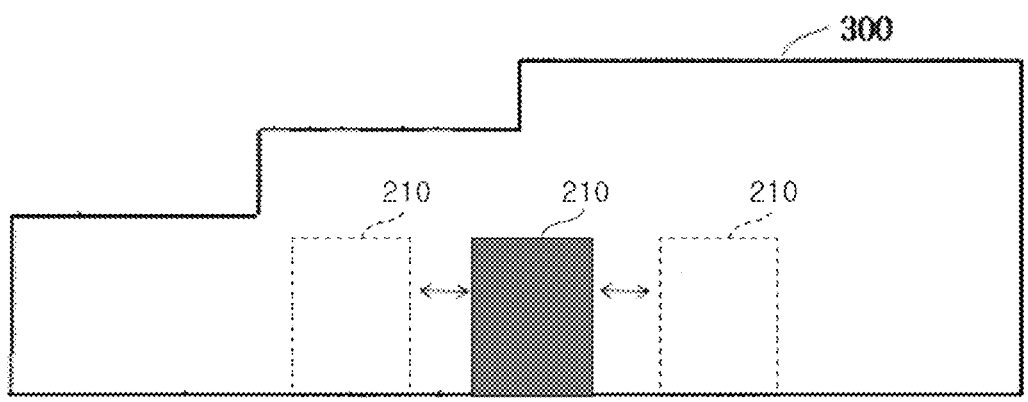
FIG. 6 is a cross-sectional view illustrating a waveguide including a block part according to an exemplary embodiment.

FIG. 6 is a cross-sectional view illustrating a waveguide including a block part according to an exemplary embodiment.

Referring to FIG. 6, the waveguide 300 has a plurality of step parts, and a block part of a predetermined height at an inner side surface of the waveguide opposite to a height boundary surface of the step parts. In this instance, the block part is a separate member from the waveguide, and is disposed at the inner side surface of the waveguide as it is. Accordingly, a location of the block part is adjustable by a user in a simple manner based on a matching condition as shown in FIG. 6, and further, because the block part does not penetrate into a wall of the waveguide, a problem of microwaves leaking out through the waveguide is prevented.

As described hereinabove, through a step part and a block part of a predetermined height as a separate member provided at one side of the waveguide opposite to the step part, the present disclosure may greatly increase a microwave density within the step part by matching microwaves of various frequencies generated and propagated from the waveguide. That is, the block part according to the present disclosure is not physically fixed at and coupled to the inner side surface of the waveguide, and is a separate member that may be disposed on the inner side surface. Thus, the separate member may be made from the same material as the waveguide or a different material from the waveguide, and according to necessity, any design change may be made based on a purpose of use of a plasma by changing its shape freely.

It should be understood that unless specially stated to the contrary, the terms "including", "comprising", or "having" used herein specify the presence of stated components, but do not preclude the presence or addition of one or more other components. Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The above description only exemplifies the technical spirit of the present disclosure, and it will be understood by those skilled in the art to which the present disclosure pertains that various modifications and changes may be made without departing from the essential characteristics of the present disclosure. Accordingly, the embodiments disclosed in the present disclosure are not intended to limit but describe the technical spirit of the present disclosure, and the range of the technical spirit of the present disclosure is not limited by the embodiments. The protection range of the present disclosure should be interpreted by the appended claims, and all technical spirits within the equivalent scope should be interpreted as being included in the scope of the present disclosure.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A plasma waveguide comprising:
a plurality of step parts formed at any one side on an inner side surface of the waveguide; and
a block part of a predetermined height formed at any other side on the inner side surface of the waveguide,
wherein the block part is formed at a side opposite to a boundary part between the plurality of step parts, and
wherein a distance between the block part and the step part varies from 30% to 70% based on a waveguide height of a low height among the step parts.

2. The plasma waveguide of claim 1, wherein the step parts are a taper part with a height decreasing at a predetermined angle.

3. The plasma waveguide of claim 2, wherein the block part is included within an area opposite to the taper part.

4. The plasma waveguide of claim 3, wherein the block part is coupled with the inner side surface of the waveguide.

5. The plasma waveguide of claim 4, wherein the block part is a separate member that is not physically coupled with the inner side surface of the waveguide, and a location of the block part is adjustable.

6. The plasma waveguide of claim 1, wherein each of the step parts is formed of a tapering shape.

7. The plasma waveguide of claim 1, wherein the block part has a cross section of a circular shape.

8. The plasma waveguide of claim 1, wherein the step parts has a vertically decreasing height.

9. The plasma waveguide of claim 8, wherein the block part is coupled with the inner side surface of the waveguide.

10. The plasma waveguide of claim 9, wherein the block part is a separate member that is not physically coupled with the inner side surface of the waveguide, and a location of the block part is adjustable.

11. The plasma waveguide of claim 8, wherein the block part has a cross section of a circular shape.

12. A waveguide system comprising: a waveguide comprises:
   a plurality of step parts formed at any one side on an inner side surface of the waveguide; and
   a block part of a predetermined height formed at any other side on the inner side surface of the waveguide,
   wherein the block part is formed at a side opposite to a boundary part between the plurality of step parts; and
   where in a distance between the block part and the step part varies from 30% to 70% based on a waveguide height of a low height among the step parts.

13. The waveguide system of claim 12, wherein the step part is formed of a tapering shape with a predetermined angle.

14. The waveguide system of claim 13, wherein the block part is coupled with the inner side surface of the waveguide.

15. The plasma waveguide of claim 14, wherein the block part is a separate member that is not physically coupled with the inner side surface of the waveguide, and a location of the block part is adjustable.

16. The plasma waveguide of claim 12, wherein the block part has a cross section of a circular shape.

* * * * *